(12) United States Patent
Hirano et al.

(10) Patent No.: US 7,934,962 B2
(45) Date of Patent: May 3, 2011

(54) CONTACT PROBE PIN

(75) Inventors: Takayuki Hirano, Hyogo (JP); Takashi Miyamoto, Hyogo (JP)

(73) Assignees: Kobe Steel, Ltd., Kobe-shi (JP); Kobelco Research Institute, Inc., Kobe-shi (JP)

( * ) Notice: Subject to any disclaimer, the term of this patent is extended or adjusted under 35 U.S.C. 154(b) by 0 days.

(21) Appl. No.: 12/850,206

(22) Filed: Aug. 4, 2010

(65) Prior Publication Data

US 2011/0034093 A1 Feb. 10, 2011

(30) Foreign Application Priority Data

Aug. 7, 2009 (JP) ................................. 2009-185271

(51) Int. Cl.
*B23B 9/00* (2006.01)
(52) U.S. Cl. ....................................... 439/886; 428/408
(58) Field of Classification Search .................. 428/408, 428/698, 699, 336, 426; 439/886, 887
See application file for complete search history.

(56) References Cited

U.S. PATENT DOCUMENTS

| 4,767,591 A * | 8/1988 | Wampler ....................... 376/143 |
| 7,115,863 B1 * | 10/2006 | Ishibashi et al. ............... 250/306 |
| 7,709,759 B2 * | 5/2010 | Lewin et al. ................... 200/270 |
| 2003/0087096 A1 * | 5/2003 | Sato et al. ...................... 428/408 |
| 2006/0040105 A1 * | 2/2006 | Sato et al. ...................... 428/408 |

FOREIGN PATENT DOCUMENTS

| JP | 2001-289874 | 10/2001 |
| JP | 2002-318247 | 10/2002 |
| JP | 2003-231203 | 8/2003 |
| JP | 2007-24613 | 2/2007 |

* cited by examiner

*Primary Examiner* — Gary F. Paumen
(74) *Attorney, Agent, or Firm* — Oblon, Spivak, McClelland, Maier & Neustadt, L.L.P.

(57) ABSTRACT

The present invention provides a contact probe pin having both electrical conductivity and durability and being capable of realizing low adhesion to the device under test (particularly, tin contained therein) and thereby stably maintaining electrical contact over a long period of time. The present invention relates to a contact probe pin comprising: a base material; and a carbon film comprising at least one of a metal and a carbide thereof, wherein the carbon film is continuously formed over the surface of from a tip part of the contact probe pin to a lateral part of the contact probe pin, and a content of the at least one of a metal and a carbide thereof in the carbon film is continuously or intermittently decreased from the tip part toward the lateral part.

6 Claims, 5 Drawing Sheets

CONTACT PROBE PIN

CROSS-REFERENCE TO RELATED APPLICATIONS

This application claims priority from Japanese Patent Application No. 2009-185271 filed on Aug. 7, 2009, the entire subject matter of which is incorporated herein by reference.

BACKGROUND OF THE INVENTION

1. Field of the Invention

The present invention relates to a contact probe pin used for testing electrical properties of a semiconductor device. More specifically, the present invention relates to a contact probe pin having durability high enough not to deteriorate in the electrical conductivity even by the repetition of the test.

2. Description of the Related Art

An electronic component such as integrated circuit (IC), large-scale integrated circuit (LSI) and light emitting diode (LED) (that is, an electronic component using a semiconductor device) is tested for its electrical properties by contacting a probe pin with the electrode of the semiconductor device. The probe pin (contact probe pin) used in such a testing apparatus (semiconductor testing apparatus) is required to, as well as having good electrical conductivity (low contact resistance value), have excellent durability to such an extent of not causing wear or damage even by the repeated contact with an electrode as a device under test.

The contact resistance value of the contact probe pin is generally set to 100 mΩ or less but is sometimes disadvantageously increased to from hundreds of mΩ to several Ω by the repeated testing with a device under test.

As for the measure to solve such a problem, cleaning of the contact probe pin or replacement of the contact probe pin itself is employed. However, such a measure incurs a significant reduction in reliability and operation rate of the test process, and it is demanded to realize a contact probe pin capable of bringing out properties of causing no disadvantageous increase in the contact resistance value even by the use over a long period of time. In particular, the device under test (electrode) formed of a material such as solder or tin plating has a property that the surface is susceptible to oxidization and at the same time, because of a soft material, the device under test is shaved off by the contact with the contact probe pin and is liable to adhere to the tip part of the contact probe pin making it difficult to perform stable contact.

As for the method to stabilize the contact resistance value, a technique of coating a carbon film on the vicinity of the tip part of the contact probe pin (the tip part coming into contact with the electrode and the vicinity thereof) has been proposed (see, for example, JP-A-2001-289874 (the term "JP-A" as used herein means an "unexamined published Japanese patent application"), JP-A-2002-318247, JP-A-2003-231203 and JP-A-2007-24613). An important requirement in this technique is to mix an alloy element such as tungsten (W) with the carbon film typified by diamond-like carbon (DLC) and form a surface film having both low adhesion to the device under test (electrode), which is attributed to the carbon film, and high electrical conductivity due to the action of the metal (or a carbide thereof) mixed.

SUMMARY OF THE INVENTION

According to the conventionally proposed techniques, a low contact resistance value can be realized and at the same time, excellent durability is obtained, but the adhesion to the device under test (electrode) is sometimes rather promoted. More specifically, in the conventionally proposed techniques, a predetermined amount of a metal is contained so as to improve the electrical conductivity of the carbon film, but when the amount of such a metal (or a carbide thereof) is increased, the low adhesion to the device under test (particularly, tin contained therein), which is a property inherent in the carbon film, is rather deteriorated in some cases. Such a tendency varies in the degree depending on the metal contained or the internal structure, surface profile or the like of the carbon film but is distinctly caused by considering the property of the metal or carbon film.

The present invention has been made under these circumstances, and an object of the present invention is to provide a contact probe pin having both electrical conductivity and durability and being capable of realizing low adhesion to the device under test (particularly, tin contained therein) and thereby stably maintaining electrical contact over a long period of time.

The present invention encompasses the following embodiments.

(1) A contact probe pin comprising: a base material; and a carbon film comprising at least one of a metal and a carbide thereof,
wherein the carbon film is continuously formed over the surface of from a tip part of the contact probe pin to a lateral part of the contact probe pin, and a content of the at least one of a metal and a carbide thereof in the carbon film is continuously or intermittently decreased from the tip part toward the lateral part.

(2) The contact probe pin according to (1), wherein assuming that a content of the at least one of a metal and a carbide thereof in the carbon film of the tip part is A (atomic %) and a maximum content of the at least one of a metal and a carbide thereof in the carbon film of a portion of the lateral part, the portion being not in contact with a device under test, is B (atomic %), the ratio B/A is 0.9 or less.

(3) The contact probe pin according to (1), wherein assuming that a content of the at least one of a metal and a carbide thereof in the carbon film of the tip part is A (atomic %) and a content of the at least one of a metal and a carbide thereof in the carbon film of the lateral part at a position of 10 μm on a basal side from the tip part is B' (atomic %), the ratio B'/A is 0.9 or less.

(4) The contact probe pin according to any one of (1) to (3), wherein a content of the at least one of a metal and a carbide thereof in the carbon film of the tip part is from 5 to 30 atomic %.

(5) The contact probe pin according to any one of (1) to (4), wherein the metal is one or more metals selected from the group consisting of tungsten, tantalum, molybdenum, niobium, titanium and chromium.

(6) The contact probe pin according to any one of (1) to (5), wherein the device tested by the contact probe pin comprises tin or a tin alloy.

The effects of the contact probe pin of the present invention are effectively brought out when the device tested contains tin or a tin alloy.

In the contact probe pin of the present invent, the content of the metal and/or a carbide thereof in the carbon film is set to differ between the tip part allowed to come into contact with the device under test during testing and the lateral part being not in contact with the device under test during testing, and the content of the metal or a carbide thereof in the tip part having the greatest contribution to the electrical contact is made larger than the content thereof in other portions, so that not only good electrical conductivity in the tip part but also low adhesion to the device under test (particularly tin contained therein) in other portions can be ensured and electrical contact can be stably maintained over a long period of time.

EXPLANATION OF REFERENCE

Figure 1:
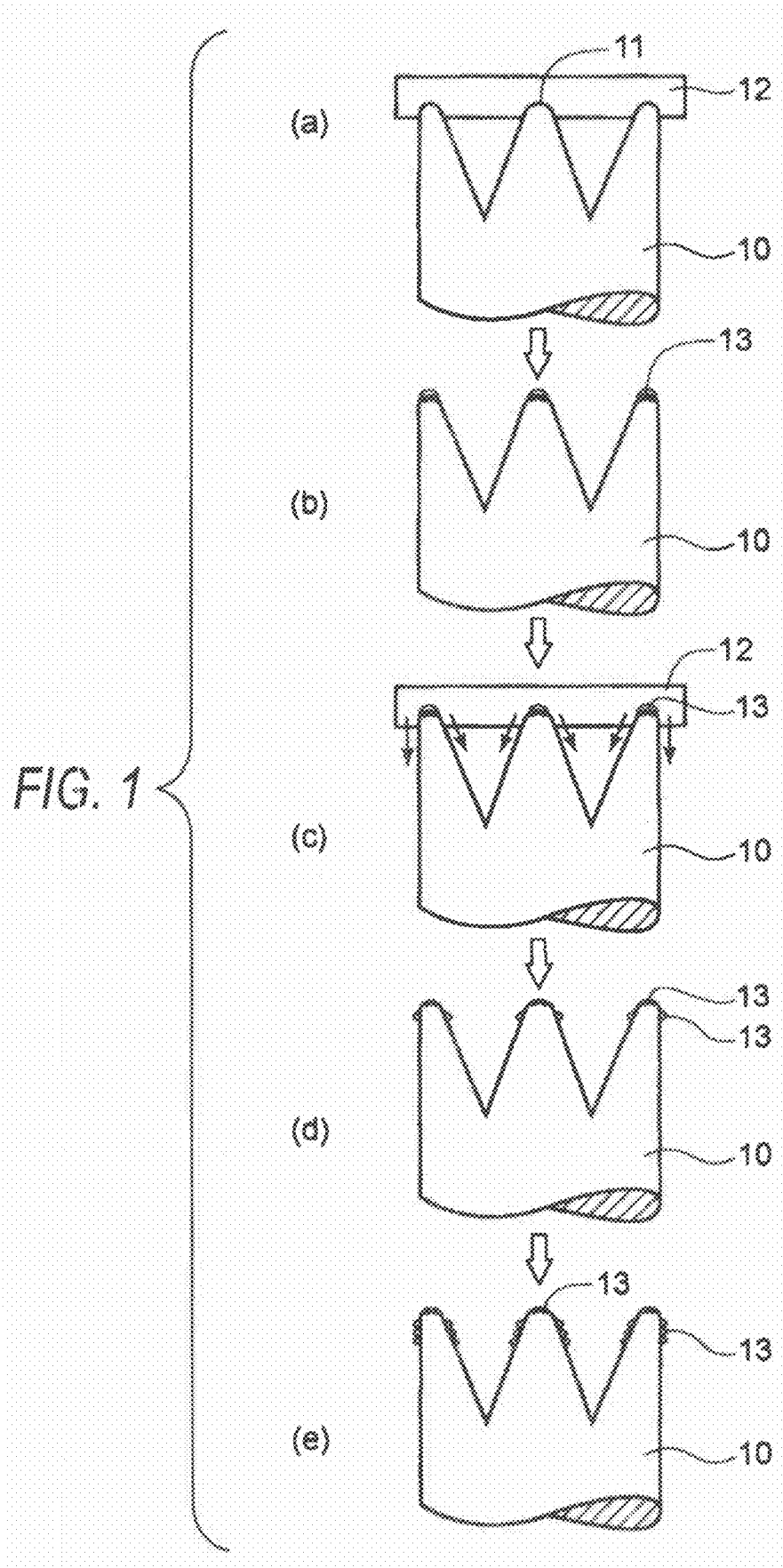
FIGS. 1(a) to 1(e) are schematic explanatory views showing the contact principle when the contact probe pin of the present invention is used.

10 Contact probe pin
11 Tip part
12 Electrode
13 Electrode material

DETAILED DESCRIPTION OF THE INVENTION

The present inventors have studied on the carbon film having contained therein a metal for imparting electrical conductivity from various angles so as to elucidate the relationship among the concentration distribution of the metal, the electrical conductivity and the durability and realize a contact probe pin capable of bringing out optimal properties. Particularly, in view of low adhesion, it has been revealed that at the contact with a device under test during testing, the metal (particularly tin) contained in the material of the device under test adheres to the probe pin and the adhered metal undergoes oxidation to incur an increase in the contact resistance and cause a trouble at the testing. In order to solve such a problem, the present inventors have realized a contact probe pin exhibiting a low contact resistance value and at the same time, being excellent in the low adhesion.

In the contact probe pin of the present invention, the content of the metal or a carbide thereof in the carbon film is set to differ between the tip part allowed to come into contact with the device under test during testing and the lateral part being not in contact with the device under test during testing, and the content of the metal or a carbide thereof in the tip part having the greatest contribution to the electrical contact is made larger than the content thereof in other portions, so that not only good electrical conductivity in the tip part but also low adhesion to the device under test (particularly tin contained therein) in other portions can be ensured.

The operation and effects of the contact probe pin of the present invention are specifically described below by referring to the drawings. FIGS. 1(a) to 1(e) are schematic explanatory views showing the contact principle when the contact probe pin of the present invention is used. For comparison, the contact principle when using a contact probe pin on the assumption that the content in the carbon film is uniform over the range from the tip part to the lateral part (conventional technique) is shown in FIGS. 2(a) to 2(e) (schematic explanatory views). Incidentally, as for the contact portion (the portion coming into contact with a device under test) of the contact probe pin, various shapes are known, but a contact portion divided in quarters (in FIGS. 1(a) to 1(e) and FIGS. 2(a) to 2(e), the portion is projected from the side and shown as three protrusions) is illustrated here. However, the contact probe pin of the present invention is not limited to the shape divided in quarters. For example, the shape of the contact probe pin may be divided into three, two or the like, may not be divided or may have a mortar shape.

In the contact probe pin 10 during testing, the tip part 11 (that is, when the shape of the probe pin is divided, the apex of each protrusion) comes into contact with an electrode 12 as the device under test. In this case, in order to ensure the contact area to a certain extent while reducing the effect of the oxide film formed on the surface of the electrode 12, the probe pin is generally put into contact in the form of deforming/denting a part of the electrode (FIG. 1(a), FIG. 2(a)).

For testing a large number of electronic components, in the course of repeating contact with an electrode 12 and energization, a material 13 (electrode material) constituting the electrode as the device under test gradually adheres to the energized portion of the contact probe pin [FIG. 1(a), FIG. 2(a)]. The part of the electrode material 13 adhered to the energized portion is afterward oxidized or prevents ensuring an effective contact area and therefore, when such a state is kept intact, this gives rise to fluctuation of the contact resistance value (FIG. 1(b), FIG. 2(b)).

Meanwhile, the tip of the contact probe pin is formed in an acute shape and, due to the effect based on the shape, produces an action to remove the adhered electrode material with repeated contact (FIG. 1(c), FIG. 2(c)). At this time, when the lateral part is configured to have a smaller content of the metal or a carbide thereof as in the contact probe pin of the present invention, the adhesive force in the portion intrinsically susceptible to adhesion of the electrode material 13 (lateral part) is reduced, and the electrode material 13 cut off from the tip part region is easily expelled from the contact portion without readhesion by the wayside (FIG. 1(d)), so that a normal surface can be always exposed in the contact portion and the stable contact resistance can be continuously maintained (FIG. 1(e)).

On the other hand, in the conventional contact probe pin shown in FIGS. 2(a) to 2(e), the expelling effect of expelling the electrode material from the tip part 11 opposite the electrode 12 is not sufficiently high as compared with the case shown in FIGS. 1(a) to 1(e). Even if the difference in expelling effect is small, in the course of repeated use from tens of thousands to hundreds of thousands of times, the deposit (electrode material 13) failed to be completely removed is gradually accumulated also in the portion kept from coming into contact during test (FIG. 2(d)) and stands as a barrier to further deteriorate the expelling effect, as a result, the state of the tip part 11 is more worsened (FIG. 2(e)) and a large difference is produced in the stability of the electric resistance value.

In order to bring out the effect described above, the carbon film may be a film configured such that the content of the metal or a carbide thereof is continuously or intermittently decreased as it proceeds from the tip part (when the tip part is divided, the apex of each protrusion) toward the lateral part of the contact probe pin. However, for more effectively bringing out the effect, assuming that the content of the metal and/or a carbide thereof in the carbon film of the tip part is A (atomic %) and the maximum content of the metal and/or a carbide thereof in the carbon film of the lateral part being not in contact with the device under test is B (atomic %), the ratio therebetween (B/A) is preferably 0.9 or less.

The "lateral part being not in contact with the device under test" means a portion closer to the basal side (opposite the tip part) than the portion where the tip part is buried in the device under test during testing and out of such a lateral part, the potion closest to the tip part (in the viewpoint above, the content of this portion becomes the maximum content in the lateral part) varies also depending on the shape or use state of the contact probe pin.

A specific indication of the lateral part being not in contact with the device under test is usually the position at 10 μm on the basal side from the tip part. That is, the specific configuration includes a configuration where assuming that the content of the metal and/or a carbide thereof in the carbon film of the tip part is A (atomic %) and the content of the metal and/or a carbide thereof in the carbon film of the lateral part at the position of 10 μm on the basal side from the tip part is B' (atomic %), the ratio therebetween (B'/A) is 0.9 or less. The (B'/A) at the position of 30 μm on the basal side from the tip part is preferably 0.8 or less.

In the light of production principle, the metal contained in the carbon film takes the form of a metal itself or a carbide (or a mixed state), and the contact resistance value of the carbon film is determined by the content thereof, but an optimal value is present according to the shape or effective contact area of the contact probe pin, the contact resistance value required during testing, or the necessary number of tests (number of inspections). From this standpoint, the content of the metal and/or a carbide thereof in the carbon film of the tip part of the contact probe pin is preferably from 5 to 30 atomic %. Namely, in order to impart electrical conductivity (realize low resistance) at the tip part while producing a difference in the content of the metal and/or a carbide thereof between the tip part and the lateral part, the content of the metal and/or a carbide thereof in the tip part is preferably from 5 to 30 atomic %. Furthermore, based on the later-described experimental data (FIGS. 4 and 5), in view of satisfying both low resistance and tin-expelling effect, the content of the metal and/or a carbide thereof in the tip part is preferably about 15 to 25 atomic %.

Figure 4:
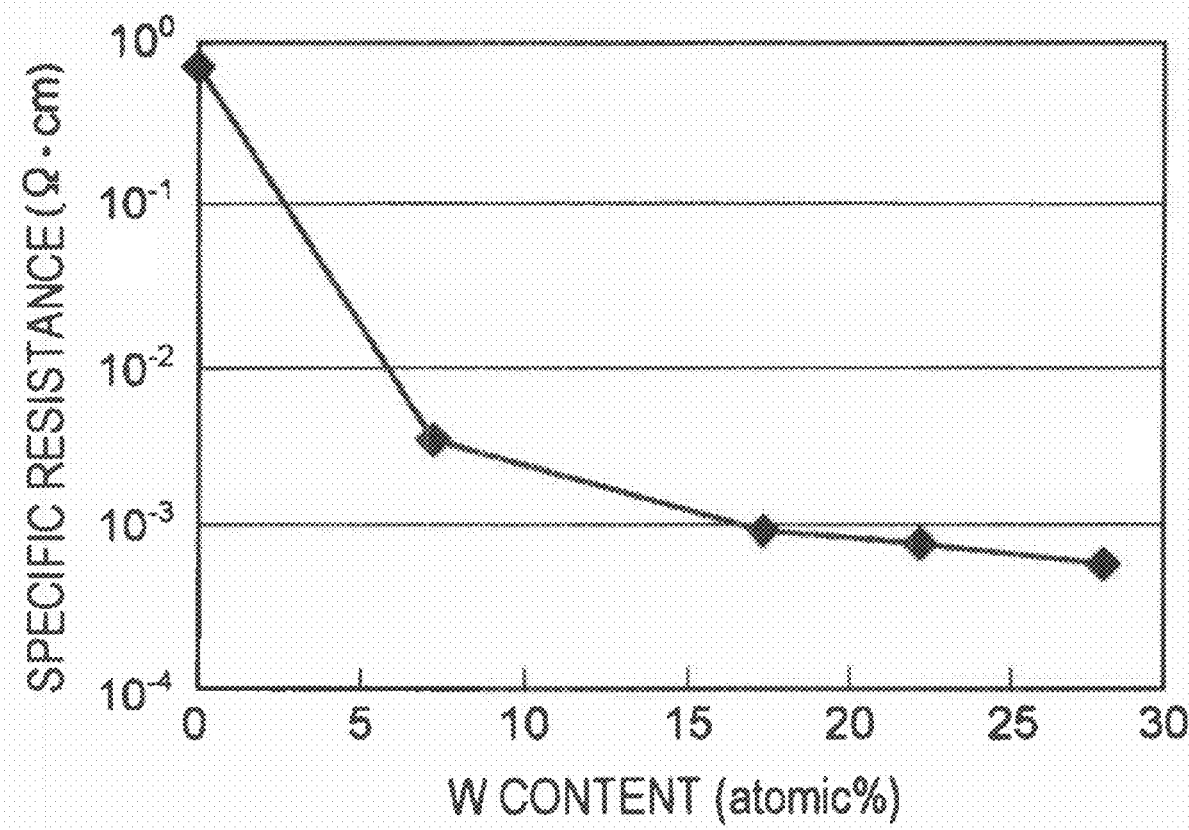
FIG. 4 is a graph showing the relationship between the content of W in the carbon film and the specific resistance.
Figure 5:
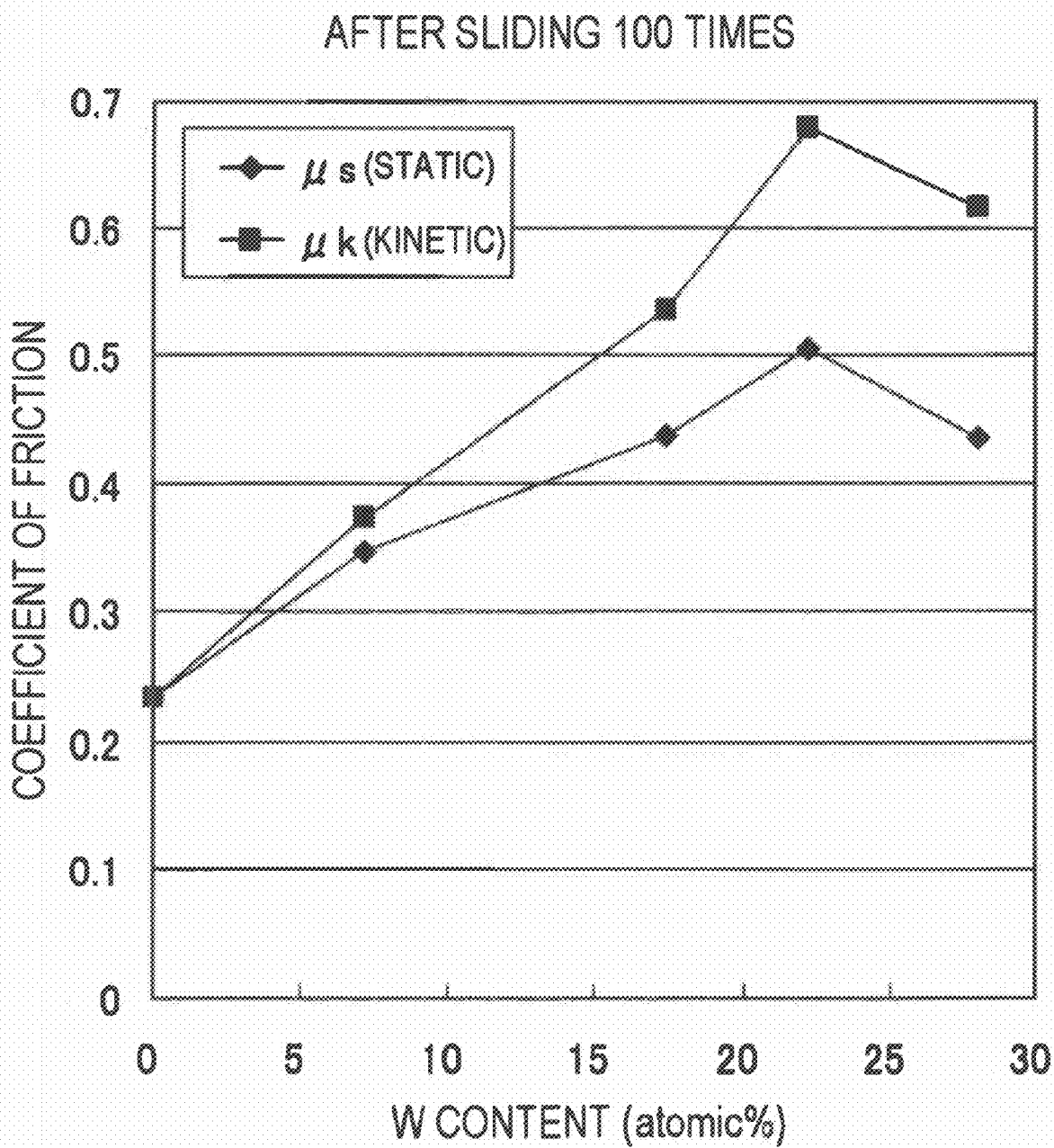
FIG. 5 is a graph showing the relationship between the content of W in the carbon film and the coefficient of friction.

Also, as shown in FIG. 4, the specific resistance is almost maintained at a low value when the content of the metal and/or a carbide thereof is 10 atomic % or more. In particular, the content of the metal and/or a carbide thereof in the tip part, which is necessary for energization properties, is preferably 15 atomic % or more. The tip part exhibits an excellent energization performance particularly when the content of the metal and/or a carbide thereof is, as described above, 15 atomic % or more, but in view of adhesion of tin, the content is preferably 25 atomic % or less as shown in FIG. 5.

In the case where the metal contained in the carbon film is a metal capable of easily forming a carbide, the metal is uniformly dispersed in the carbon film and kept at an amorphous uniform state. From this standpoint, examples of the metal contained in the carbon film include tungsten (W), tantalum (Ta), molybdenum (Mo), niobium (Nb), titanium (Ti) and chromium (Cr). One or more kinds of these metals can be used. Of these metals, tungsten is most preferred in consideration of stability of the carbide.

The device under test (electrode) that is tested by the contact probe pin is usually composed of solder or tin alloy, but such a material basically contains tin, and this tin is especially liable to adhere to the surface of the contact probe pin. Accordingly, in particular, when the contact probe pin of the present invention is applied to a device under test which is composed of tin or a tin alloy, its effects are effectively brought out.

Depending on the production method of the contact probe pin of the present invention, the carbon film (particularly, the carbon film of the tip part) contains Ar, but in view of microstructuring the carbon film and thereby enhancing the strength of the carbon film, it is preferred to contain Ar in the carbon film. Such a configuration is considered to also more enhance the durability of the contact probe pin of the present invention. In order to bring out these effects, the content of Ar is preferably from 2 to 10 atomic %. Furthermore, since the tip part is required to have higher hardness and be denser, the content of Ar in the tip part is preferably larger than the content of Ar in the lateral part In the contact probe pin of the present invention, if the thickness of the carbon film is too small, the effect of forming a carbon film may not be brought out, and therefore, the thickness is preferably 0.1 μm or more. However, if the thickness of the carbon film is excessively large, the resistance tends to increase, and for this reason, the thickness is preferably 10 μm or less. The thickness of the carbon film is more preferably 0.2 μm or more and is more preferably 2 μm or less.

In fabricating a contact probe pin, as the base material (or core), for example, beryllium copper (Be—Cu), palladium (Pd) or an alloy thereof, or carbon tool steel is used in consideration of strength, electrical conductivity or the like, but there is a tendency that adherence between such a material and the carbon film is basically bad. Therefore, in order to enhance the adherence between the base material and the carbon film, it is also a preferred configuration to interpose an intermediate layer (adherence layer) between these two members and enhance the adherence therebetween.

The intermediate layer may be appropriately selected according to the kind of the base material, but examples thereof include a metal layer such as Cr and Cr-based alloy, and a mixed layer of these and C. Any one of these layers may be laminated at least in one or more layers to form an intermediate layer. The more specific configuration includes a configuration where a layer composed of a metal having good adherence to the base material is formed on the base material side and a gradient layer (a layer composed of a metal and carbon) with the carbon content being incrementally increased from the base material side to the carbon film side is formed thereon.

In order to form a carbon layer having the above-described concentration distribution of the metal or carbide, the conditions for its production are also preferably set appropriately. As for the method to form the carbon film on the base material, a sputtering method is usually employed. In forming a carbon film having a uniform concentration distribution of a metal or carbide by applying a sputtering method, the base material is disposed by arranging its axial core direction to run in parallel with the target face, and the carbon film is formed while rotating the base material.

In order to uniformly form a carbon film on a three-dimensional bar-like structure such as probe pin, a tool material or the like is a good example but usually, a method of disposing the base material such that its axial core direction runs in parallel with the target face, keeping a sufficient distance from the target, and forming the film while rotating the base material is often used. A hard film such as DLC has a high film stress, and the film readily falls off unless a dense film is formed also on the side. Therefore, the above-described method is generally employed by placing importance on the adherence or uniformity of the film attached.

Figure 2:
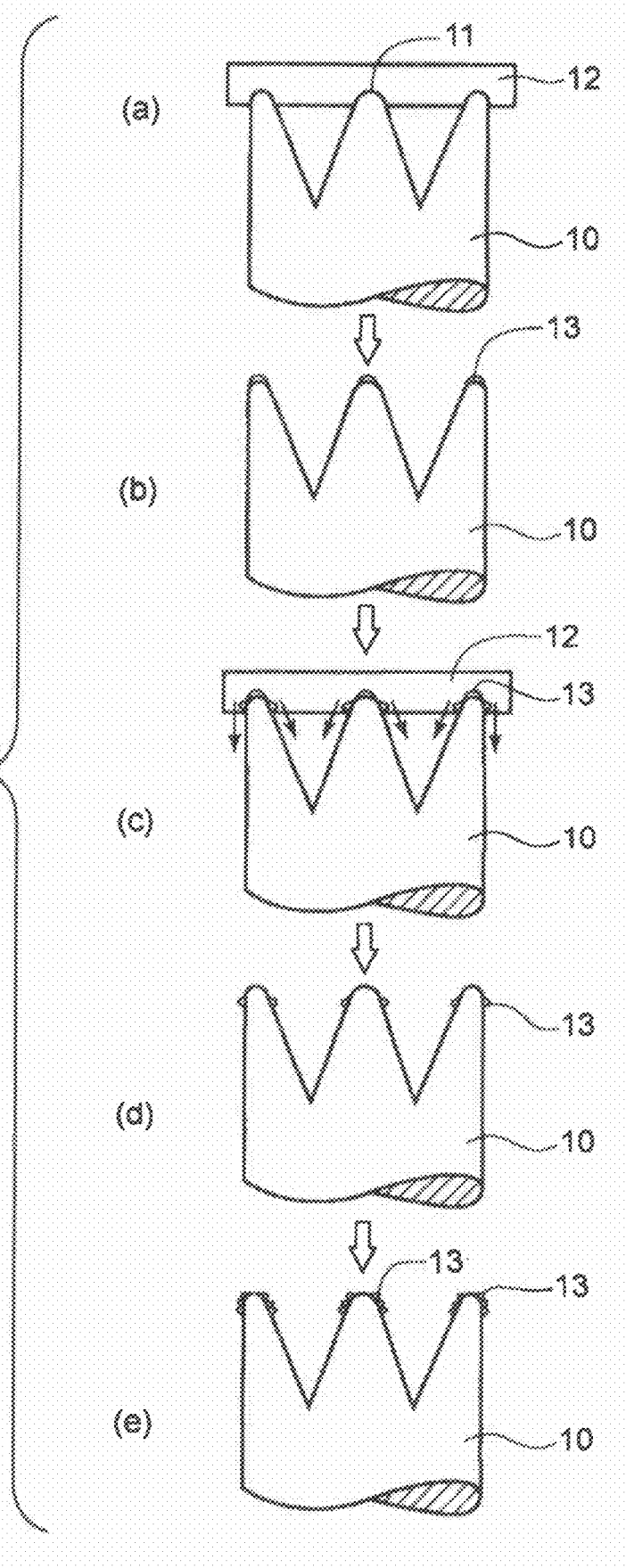
FIGS. 2(a) to 2(e) are schematic explanatory views showing the contact principle when the conventional contact probe pin is used.

However, it is revealed that in such a method, a carbon film having the concentration distribution of a metal specified in the present invention is not formed and rather, the content of the metal in the tip part is lower. Alternatively, in the case of a contact probe pin with the tip part being divided (FIGS. 1(*a*)

to 1(*e*), FIGS. 2(*a*) to 2(*e*)), the complicated shape sometimes makes it difficult to form a carbon film with a uniform thickness in the tip part.

It has been found that for forming a carbon film having the concentration distribution of a metal or carbide specified in the present invention, this is attained by placing the base material and the target relatively in proximity and arranging the axial core direction of the base material to run perpendicularly to the target face. A carbon film differing in the content with the position of the contact probe pin is considered to be formed by such a method because of the effect of the directional component in which the metal constituent element and carbon is coming flying.

Also, when applying a sputtering method, a bias voltage is usually applied to the base material, and by applying a bias voltage, the plasma on the target, which is generated during sputtering, extends also in the base material direction and comes into proximity to the base material. Due to such an effect, the difference in the directional component where the metal element and carbon are coming flying can be more intensified, and this is considered to contribute to the formation of the above-described carbon film. Furthermore, it is estimated that the concentration distribution of the metal and/or carbide thereof can be controlled also by the difference in the ion incident angle between the top surface of the probe (on which ion enters perpendicularly) and the side surface (on which ion enters obliquely with respect to the surface) of the probe.

The present invention is described in greater detail below by referring to Examples, but the present invention is not limited to the following Examples and may also be executed by adding appropriate changes or modifications within a range conforming to the purport of the invention described above and later, all of which are included in the technical scope of the present invention.

EXAMPLES

Example 1

A spring-containing contact probe pin with the tip part being divided in quarters similarly to those shown in FIGS. 1(*a*) to 1(*e*) and FIGS. 2(*a*) to 2(*e*) was used. A metal was doped into carbon film, and in order to control the concentration distribution of the metal, the following method was further employed.

In a parallel plate-type magnetron sputtering apparatus (manufactured by Shimadzu Corporation), a carbon (graphite) target and a chromium target were disposed, and a base material (made of Be—Cu) of the contact probe pin was disposed by arranging its tip part to face the targets (disposed such that the axial core direction of the base material runs perpendicularly to the target face). At this time, for allowing the carbon film to be formed only in a region of about 0.3 mm from the tip part toward the basal part of the contact probe pin, the portion other than that was masked with a jig. Also, the distance between the tip part of the base material and the target was set to 55 mm.

A tungsten (W) chip was placed on the carbon (graphite) target so that they were simultaneously sputtered, and the concentration thereof was adjusted such that the content of W when deposited on the plate became from 18 to 22 atomic %.

The inside of the sputtering chamber was vacuum-evacuated to $6.7 \times 10^{-4}$ Pa or less and then, the pressure was adjusted to 13 Pa by introducing an argon (Ar) gas. A high-frequency voltage was applied to the base material to effect Ar ion etching and thereafter, while alternately depositing a carbon film containing Cr and W and a Cr layer as an adherence layer between the base material and the carbon film, an intermediate layer having a gradient composition formulated to gradually increase in the ratio of the carbon film was deposited. Finally, at the deposition of the outermost surface, the graphite target having thereon a W chip was sputtered using DC magnetron discharge at a charged power density of $5.7 \times 10^{-4}$ W/m², and a bias voltage of $-20$ V was applied to the base material, whereby coating to a thickness of about 400 nm (0.4 µm) was performed.

The contact probe pin after forming the carbon film as above was analyzed by EPMA (Electron Probe X-ray Micro Analyzer, X-ray microanalyzer "JXA-8800RL", manufactured by JEOL Ltd.) for the composition at each position under the following conditions.

Figure 3:
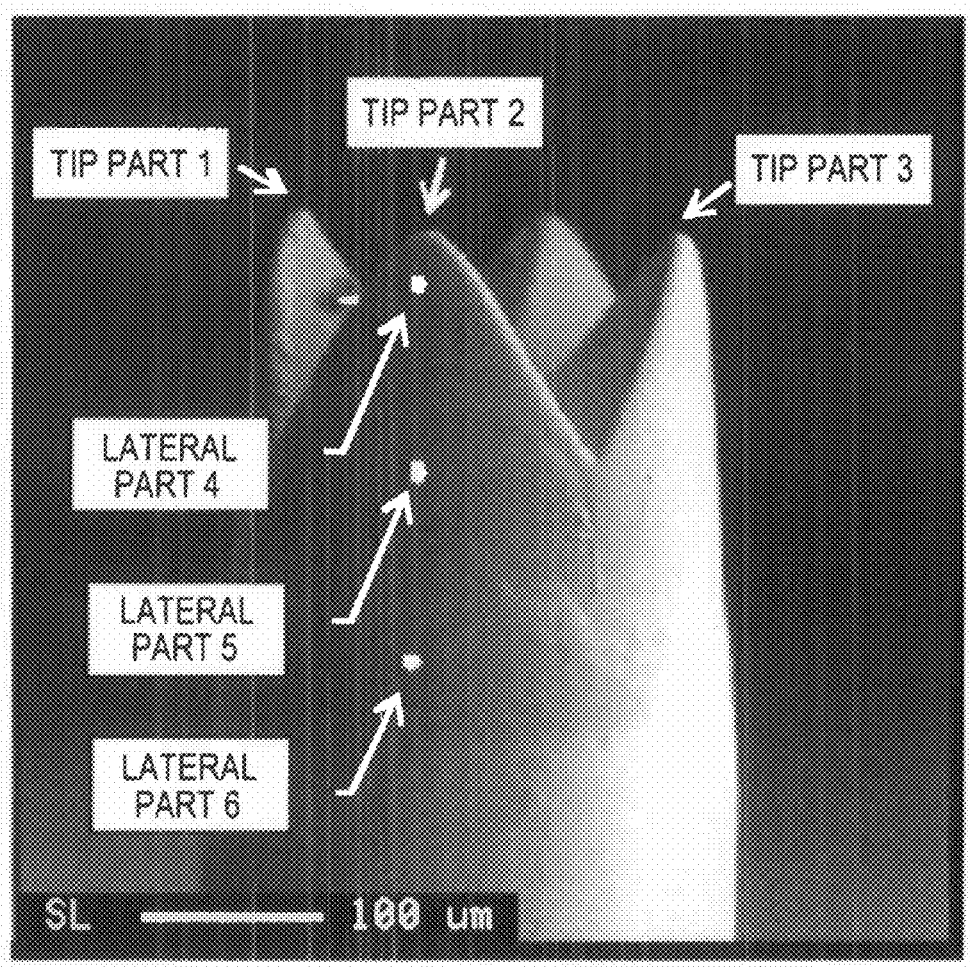
FIG. 3 is a drawing-substituting micrograph showing the vicinity of the tip part of the contact probe pin.

(EPMA Measurement Conditions)
Accelerating voltage: 10 kV
Irradiation current: 0.1 µA
Analysis method: quantitative analysis (designated elements: C, Ar and W)
Analysis range: 0.2 µm in diameter The results of composition analysis are shown in Table 1 below. In Table 1, tip parts 1 to 3 (that is, apexes of divided protrusions) and lateral parts 4 to 6 indicate respective positions shown in FIG. 3 (a drawing-substituting micrograph showing the vicinity of the tip part of the contact probe pin). Also, the position denoted by lateral part 4 in FIG. 3 corresponds to the position at 30 µm (the position having the maximum content in the lateral part) from the tip parts 1 to 3 toward the basal part (downward in FIG. 3).

TABLE 1

| Measurement position | Content (atomic %) of each component in carbon film | | |
|---|---|---|---|
| | C | Ar | W |
| Tip part 1 | 77.7 | 4.8 | 17.5 |
| Tip part 2 | 76.5 | 4.6 | 18.9 |
| Tip part 3 | 76.4 | 4.2 | 19.4 |
| Lateral part 4 | 86.0 | 3.2 | 10.8 |
| Lateral part 5 | 87.8 | 2.6 | 9.6 |
| Lateral part 6 | 88.5 | 2.7 | 8.8 |

Example 2

A carbon film was formed under the same conditions as in Example 1 except for changing the bias voltage to $-100$ V and analyzed for the composition (atomic %) at each position in the same manner.

(Results of Composition Analysis)
Tip part: C: 73.0, Ar: 4.1, W: 22.9
Lateral part (position at 10 µm, outer peripheral surface): C: 76.1, Ar: 4.1, W: 19.8
Lateral part (position at 10 µm, inner peripheral surface): C: 78.78, Ar: 3.57, W: 17.65
Lateral part (position at 20 µm, outer peripheral surface): C: 77.4, Ar: 3.7, W: 18.9

Using the contact probe pin having formed thereon the carbon film as above (Examples 1 and 2), a contact energization test was performed 100,000 times on an electrode composed of a lead-free solder (Sn+3 atomic % Cu+0.5 atomic % Ag), as a result, it was confirmed that the contact probe pin exhibits excellent resistance stability as compared with the conventional contact probe pin (Au-plated product).

Comparative Example

A carbon film was formed on the surface of the base material (produced by Yokowo Co., Ltd.) of the contact probe pin by performing sputtering in the same manner as above except for arranging the axial core direction of the base material to run in parallel to the target face (other conditions were the same as above). The contact probe pin having formed thereon the carbon film in this way was analyzed for the composition at each position in the same manner as in Example 1.

The results of composition analysis are shown in Table 2. In Table 2, tip parts 1 to 3 and lateral parts 4 to 6 indicate the same positions as in Example 1.

TABLE 2

| Measurement position | Content (atomic %) of each component in carbon film | | |
|---|---|---|---|
|  | C | Ar | W |
| Tip part 1 | 91.5 | 1.2 | 7.3 |
| Tip part 2 | 90.8 | 1.6 | 7.6 |
| Tip part 3 | 91.8 | 1.4 | 6.8 |
| Lateral part 4 | 69.6 | 5.4 | 25.0 |
| Lateral part 5 | 74.9 | 3.8 | 21.3 |
| Lateral part 6 | 74.9 | 3.9 | 21.2 |

As apparent from these results, when the carbon film is formed by arranging the axial core direction of the base material to run in parallel to the target face, the content of W fails in having the distribution specified in the present invention and rather, is lower in the tip part.

Example 3

The relationship between the content of W in the carbon film and the electric resistance (specific resistance) was examined. At this time, as a specimen, a carbon film (thickness: 0.5 μm) was formed on an insulating substrate by variously changing the content of W (the content was measured by EPMA), and the specific resistance of each carbon film was measured by the following method.

(Method for Measuring Specific Resistance)

The sheet resistance of the thin film was measured using a commercially available measuring instrument (3226 mΩ HI TESTER manufactured by Hioki E. E. Corporation+a four-probe measuring device manufactured by Kyowa Riken Ltd.) according to a four probe method generally employed in the measurement of resistance of a thin film, and the specific resistance was calculated by multiplying the measured value by the film thickness and a correction factor for sheet resistance (=4.532).

The results (the relationship between the content of W and the specific resistance) are shown in FIG. 4, and it is found that as the content of W increases, the specific resistance decreases.

With respect to the specimens obtained above, the coefficients of friction (coefficient of static friction μs, coefficient of kinetic friction μk) on the surface of the carbon film were measured under the following conditions, and the relationship between the content of W and the coefficient of friction was examined.

(Method for Measuring Coefficient of Friction)

After a lead-free solder (Sn+3 atomic % Cu+0.5 atomic % Ag) was fixed to the tip of a copper-made pin to give a tip size of 2 mm in diameter (flat) and subjected to sliding 100 times on the W-containing carbon film (DLC film) under a load of 1 kgf (9.8 N) at a sliding speed of 100 mm/min by using a sliding tester, the coefficient of friction of the solder with the carbon film was measured.

The results (the relationship between the content of W and the coefficient of friction) are shown in FIG. 5, and it is found that as the content of W increases, the coefficient of friction increases.

The invention claimed is:

1. A contact probe pin comprising: a base material; and a carbon film comprising at least one of a metal and a carbide thereof,
    wherein the carbon film is continuously formed over the surface of from a tip part of the contact probe pin to a lateral part of the contact probe pin, and a content of the at least one of a metal and a carbide thereof in the carbon film is continuously or intermittently decreased from the tip part toward the lateral part.

2. The contact probe pin according to claim 1, wherein assuming that a content of the at least one of a metal and a carbide thereof in the carbon film of the tip part is A (atomic %) and a maximum content of the at least one of a metal and a carbide thereof in the carbon film of a portion of the lateral part, the portion being not in contact with a device under test, is B (atomic %), the ratio B/A is 0.9 or less.

3. The contact probe pin according to claim 1, wherein assuming that a content of the at least one of a metal and a carbide thereof in the carbon film of the tip part is A (atomic %) and a content of the at least one of a metal and a carbide thereof in the carbon film of the lateral part at a position of 10 μm on a basal side from the tip part is B' (atomic %), the ratio B'/A is 0.9 or less.

4. The contact probe pin according to claim 1, wherein a content of the at least one of a metal and a carbide thereof in the carbon film of the tip part is from 5 to 30 atomic %.

5. The contact probe pin according to claim 1, wherein the metal is one or more metals selected from the group consisting of tungsten, tantalum, molybdenum, niobium, titanium and chromium.

6. The contact probe pin according to claim 1, wherein the device tested by the contact probe pin comprises tin or a tin alloy.

* * * * *